United States Patent
Fujimura et al.

(10) Patent No.: US 12,113,494 B2
(45) Date of Patent: Oct. 8, 2024

(54) DIFFERENTIAL AMPLIFIER CIRCUIT, RECEPTION CIRCUIT, AND SEMICONDUCTOR INTEGRATED CIRCUIT

(71) Applicant: Socionext Inc., Kanagawa (JP)

(72) Inventors: Takuya Fujimura, Kanagawa (JP); Hideki Kano, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 235 days.

(21) Appl. No.: 17/836,709

(22) Filed: Jun. 9, 2022

(65) Prior Publication Data
US 2022/0302889 A1    Sep. 22, 2022

Related U.S. Application Data (63) Continuation of application No. PCT/JP2019/049423, filed on Dec. 17, 2019.

(51) Int. Cl.
*H03F 3/45* (2006.01)
*H04L 25/03* (2006.01)

(52) U.S. Cl.
CPC ..... *H03F 3/45179* (2013.01); *H03F 3/45636* (2013.01); *H04L 25/03146* (2013.01); *H03F 2200/453* (2013.01)

(58) Field of Classification Search
CPC ............. H03F 3/45179; H03F 3/45636; H03F 2200/45

(Continued)

(56) References Cited

U.S. PATENT DOCUMENTS 7,394,310 B2 * 7/2008 Chen .................. H03F 3/45179
330/253
7,728,630 B1 * 6/2010 Ren .................. H03K 19/00384
326/86

(Continued)

FOREIGN PATENT DOCUMENTS

JP    2002-198755 A    7/2002
JP    2010-034733 A    2/2010

(Continued)

OTHER PUBLICATIONS

International Search Report Issued in International Patent Application No. PCT/JP2019/049423, dated Mar. 17, 2020 with English translation.

*Primary Examiner* — Patricia T Nguyen
(74) *Attorney, Agent, or Firm* — Rimon P.C.

(57) ABSTRACT

In a differential amplifier circuit, a differential amplifier circuit unit includes: first and second transistors provided between a current source circuit and a load circuit, which receives differential input signals at gates to generate differential output signals at drains; and a third transistor connected between sources of the first and second transistors, which receives a control signal at a gate. A replica amplifier circuit unit includes: a voltage generation circuit which generates first and second reference voltages; first and second replica transistors which receives the first and second reference voltages at gates to generate replica output signals at drains; a third replica transistor connected between sources of the first and second replica transistors, which receives the control signal at a gate; and an operational amplifier which generates the control signal according to a difference between at least one of the first and second reference voltages and the replica output signal.

20 Claims, 5 Drawing Sheets

(58) Field of Classification Search
USPC .......................................................... 330/253
See application file for complete search history.

(56) References Cited

U.S. PATENT DOCUMENTS

| | | | |
|---|---|---|---|
| 2004/0245975 A1* | 12/2004 | Tran | G05F 3/30 |
| | | | 323/313 |
| 2009/0015328 A1 | 1/2009 | Aoki et al. | |
| 2009/0140778 A1* | 6/2009 | Kikuchi | H03K 19/018585 |
| | | | 327/108 |
| 2011/0001562 A1 | 1/2011 | Sohn et al. | |
| 2017/0353165 A1 | 12/2017 | Corbishley | |
| 2023/0308065 A1* | 9/2023 | Fuhs | H03G 3/30 |

FOREIGN PATENT DOCUMENTS

| | | |
|---|---|---|
| JP | 2017-538363 A | 12/2017 |
| JP | 2018-522490 A | 8/2018 |
| WO | 2017019050 A1 | 2/2017 |

* cited by examiner

DIFFERENTIAL AMPLIFIER CIRCUIT, RECEPTION CIRCUIT, AND SEMICONDUCTOR INTEGRATED CIRCUIT

CROSS-REFERENCE TO RELATED APPLICATION

This application is a continuation application of International Application PCT/JP2019/049423 filed on Dec. 17, 2019, and designated the U.S., the entire contents of which are incorporated herein by reference.

FIELD

The embodiments discussed herein are directed to a differential amplifier circuit, a reception circuit, and a semiconductor integrated circuit.

BACKGROUND

Patent Document 1 discloses a high speed differential amplifier including a differential amplifier and a control signal generator. The differential amplifier amplifies a voltage difference between a first input signal and a second input signal, and generates an output signal. The control signal generator includes a replica differential amplifier being a replica of the differential amplifier, and generates a control signal that controls gains of the differential amplifier and of the replica differential amplifier.

Patent Document 2 discloses a gain amplifier including a first transistor, a second transistor, a resistor, and a third transistor. The first transistor includes a first control port, a first input port, and a first output port. The second transistor includes a second control port, a second input port, and a second output port. The resistor includes a first end connected to the first output port, and a second end connected to the second output port. The third transistor is connected to the first output port and the second output port, in parallel with the resistor. On applying a control voltage to the third transistor, and applying an input voltage to the first control port, the second control port is selectively modified by the control voltage to produce a desired output at the first input port and the second input port.

Patent Document 3 discloses a variable gain amplifier circuit including a first amplifier circuit, a second amplifier circuit, a third amplifier circuit, and a current mirror circuit. The first amplifier circuit includes first and second transistors having control terminals to which a differential input voltage is input, a third transistor connected between the first transistor and the second transistor, and having a control terminal to which a gain control signal is input, and an output section which outputs a differential current between a first output current and a second output current that correspond to a current flowing through the first transistor and a current flowing through the second transistor, respectively. The second amplifier circuit includes fourth and fifth transistors having control terminals to which a first voltage and a second voltage are input, respectively, a sixth transistor connected between the fourth transistor and the fifth transistor, and having a control terminal to which the aforementioned gain control signal is input, and an output section which outputs a differential current between a first current and a second current smaller than the first current that correspond to a current flowing through the fourth transistor and a current flowing through the fifth transistor, respectively. The third amplifier circuit includes seventh and eighth transistors having control terminals to which a third voltage and a fourth voltage are input, respectively, a resistor element connected between the seventh transistor and the eighth transistor, and an output section which outputs a differential current between a third current and a fourth current smaller than the third current that correspond to a current flowing through the seventh transistor and a current flowing through the eighth transistor, respectively. The current mirror circuit generates the aforementioned gain control signal in accordance with a resultant current of the first current and the fourth current and a resultant current of the second current and the third current.

Patent Document 1: Description of U.S. Patent Application Publication No. 2011/0001562
Patent Document 2: Japanese Translation of PCT International Application Publication No. JP-T-2018-522490
Patent Document 3: Japanese Laid-open Patent Publication No. 2002-198755

A gain of a differential amplifier circuit varies according to a temperature. When performing, by using parameters, control to make the gain of the differential amplifier circuit to be constant, the number of parameters is increased, the control becomes complicated, and a response speed is reduced, which are problems.

SUMMARY

A differential amplifier circuit includes: a differential amplifier circuit unit; and a replica amplifier circuit unit. The differential amplifier circuit unit includes: first and second transistors provided between a current source circuit and a load circuit, and configured to receive differential input signals at gates thereof to generate differential output signals at drains thereof; and a third transistor connected between sources of the first and second transistors, and configured to receive a control signal at a gate thereof. The replica amplifier circuit unit includes: a voltage generation circuit configured to generate first and second reference voltages; first and second replica transistors being replicas of the first and second transistors, the first and second replica transistors being configured to receive the first and second reference voltages at gates thereof to generate replica output signals at drains thereof; a third replica transistor connected between sources of the first and second replica transistors, and configured to receive the control signal at a gate thereof; and an operational amplifier configured to generate the control signal in accordance with a difference between at least one of the first and second reference voltages and the replica output signal. The operational amplifier is configured to generate the control signal so that a gain of the replica amplifier circuit unit is constant.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
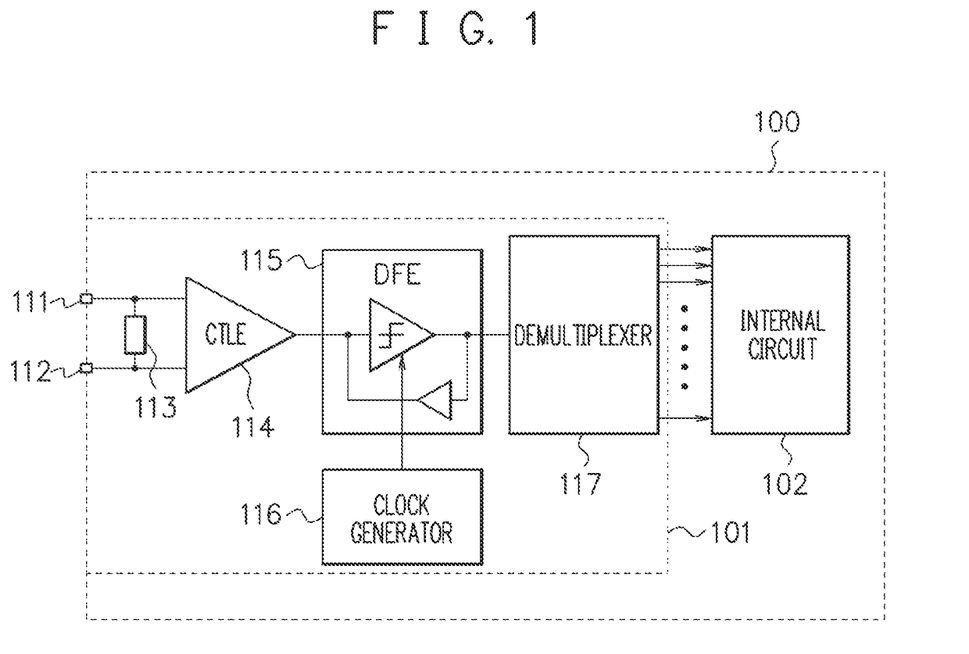
FIG. 1 is a view illustrating a configuration example of a semiconductor integrated circuit according to a first embodiment.

FIG. 1 is a view illustrating a configuration example of a semiconductor integrated circuit 100 according to a first embodiment. The semiconductor integrated circuit 100 includes a reception circuit 101 and an internal circuit 102. The reception circuit 101 includes a terminal circuit 113, a continuous time linear equalizer (CTLE) 114, a decision feedback equalizer (DFE) 115, a clock generator 116, and a demultiplexer 117.

Differential input terminals 111 and 112 receive differential signals. The terminal circuit 113 is connected between the differential input terminals 111 and 112. The terminal circuit 113 is configured by a resistor element, for example. The CTLE 114 performs equalization processing continuously on the time axis on the differential signals received by the differential input terminals 111 and 112. The DFE 115 receives an output signal of the CTLE 114, and performs equalization processing and binary determination through a feedback loop on the output signal of the CTLE 114. The clock generator 116 outputs a clock signal to the DFE 115. The demultiplexer 117 receives an output signal of the DFE 115, and converts the output signal of the DFE 115 from serial data to parallel data. The internal circuit 102 processes output signals of the demultiplexer 117.

Figure 2:
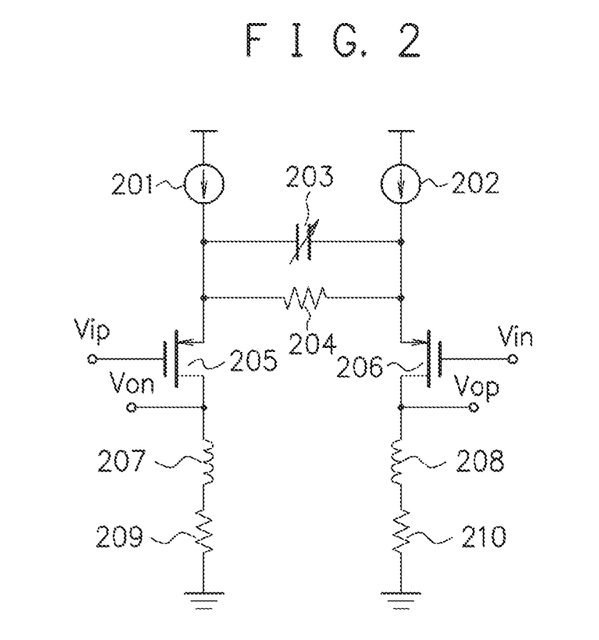
FIG. 2 is a circuit diagram illustrating a configuration example of a differential amplifier circuit unit in a CTLE in FIG. 1.

FIG. 2 is a circuit diagram illustrating a configuration example of a differential amplifier circuit unit in the CTLE 114 in FIG. 1. The differential amplifier circuit unit includes current sources 201, 202, a variable capacitor 203, a resistor 204, p-channel field effect transistors 205, 206, inductors 207, 208, and resistors 209, 210. The differential amplifier circuit unit amplifies differential signals input to differential input terminals Vip and Vin, and outputs the amplified differential signals from differential output terminals Vop and Von.

Figure 3:
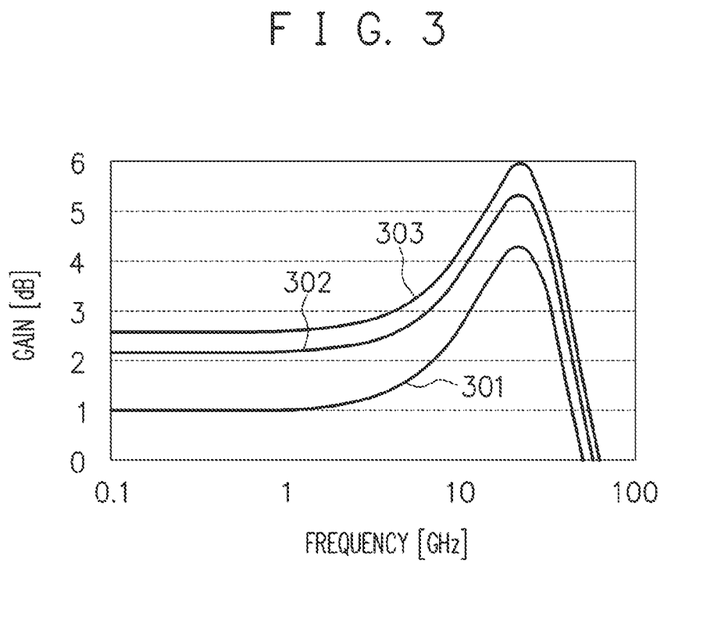
FIG. 3 is a view illustrating a characteristic of a gain with respect to a frequency in the differential amplifier circuit unit in FIG. 2.

FIG. 3 is a view illustrating a characteristic of a gain with respect to a frequency in the differential amplifier circuit unit in FIG. 2. The differential amplifier circuit unit is a high frequency equalizer, and a gain in a high frequency band is high. A gain characteristic 301 is a characteristic at −40 ft. A gain characteristic 302 is a characteristic at 25° C. A gain characteristic 303 is a characteristic at 125° C. The gain of the differential amplifier circuit unit varies according to the temperature. The variation in the gain of the differential amplifier circuit unit due to the temperature, causes a reception error in the reception circuit 101. The gain of the differential amplifier circuit unit is preferably constant regardless of the temperature.

The differential amplifier circuit unit can control the gain in the high frequency band by controlling a value of the variable capacitor 203. Further, the differential amplifier circuit unit can control a DC gain by controlling a value of the resistor 204. When the value of the resistor 204 is controlled in a manner that a resistance value of the resistor 204 is set to be variable to make the DC gain of the differential amplifier circuit unit to be constant, the number of parameters for setting the resistance value to be variable is increased, the control becomes complicated, and a response speed is reduced, which are problems. Hereinafter, a differential amplifier circuit capable of making a DC gain of a differential amplifier circuit unit to be constant with simple control at high speed, will be described while referring to FIG. 4.

Figure 4:
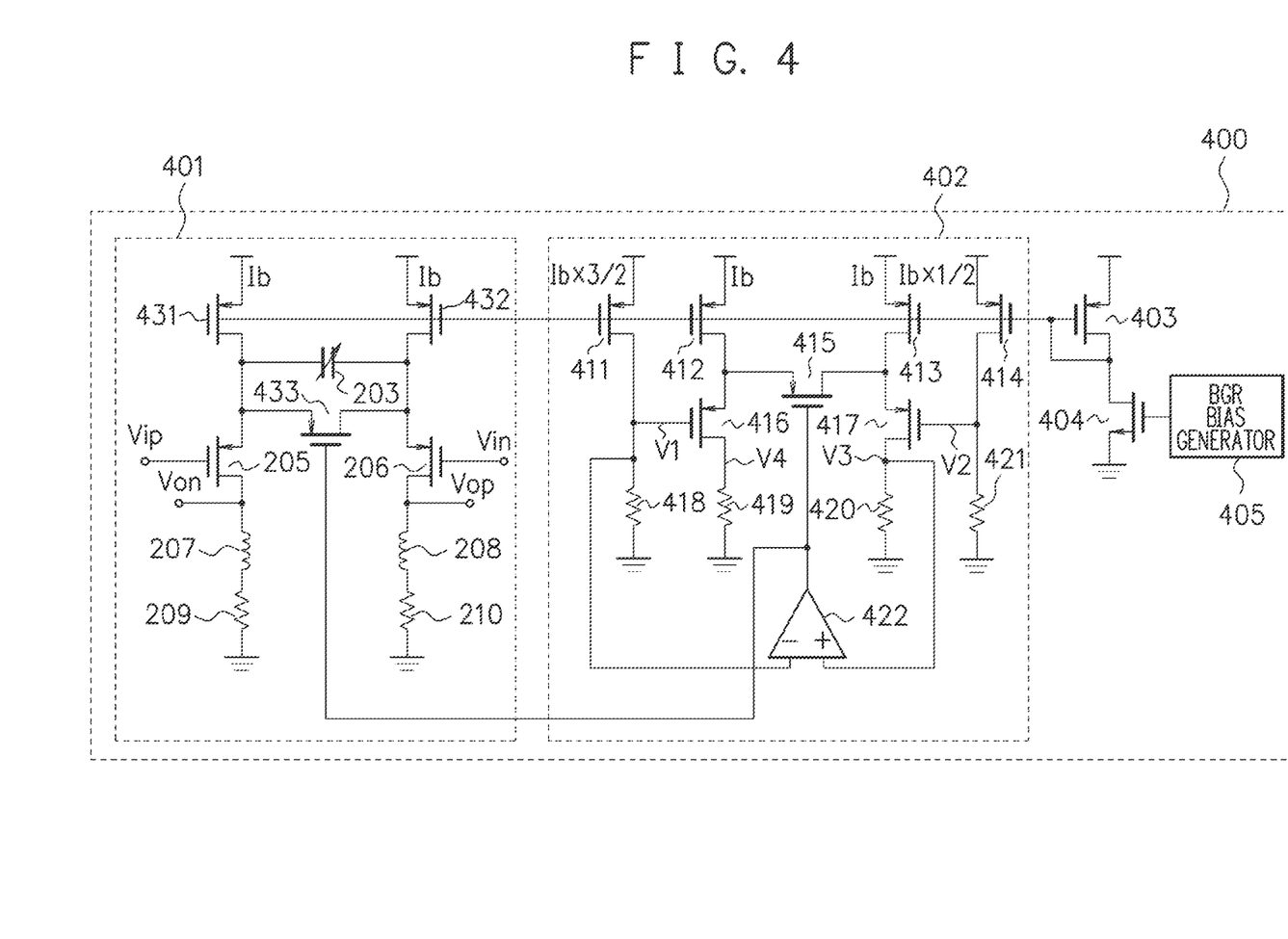
FIG. 4 is a circuit diagram illustrating a configuration example of a differential amplifier circuit according to the first embodiment.

FIG. 4 is a circuit diagram illustrating a configuration example of a differential amplifier circuit 400 according to the first embodiment. The CTLE 114 in FIG. 1 includes the differential amplifier circuit 400. The differential amplifier circuit 400 includes a differential amplifier circuit unit 401, a replica amplifier circuit unit 402, a p-channel field effect transistor 403, an n-channel field effect transistor 404, and a BGR (band gap reference) bias generator 405.

The differential amplifier circuit unit 401 corresponds to the differential amplifier circuit unit in FIG. 2, in which p-channel field effect transistors 431 and 432 corresponding to the current sources 201 and 202 are provided, and a p-channel field effect transistor 433 corresponding to the resistor 204 is provided. The differential amplifier circuit unit 401 includes the p-channel field effect transistors 431 to 433, the variable capacitor 203, the p-channel field effect transistors 205, 206, the inductors 207, 208, and the resistors 209, 210.

The p-channel field effect transistor 431 is a current source circuit, and has a source connected to a power supply potential node. The p-channel field effect transistor 432 is a current source circuit, and has a source connected to the power supply potential node, and a gate connected to a gate of the p-channel field effect transistor 431.

The variable capacitor 203 is connected between a drain of the p-channel field effect transistor 431 and a drain of the p-channel field effect transistor 432. The p-channel field effect transistor 433 has a source connected to a source of the p-channel field effect transistor 205, a gate connected to an output terminal of the operational amplifier 422, and a drain connected to a source of the p-channel field effect transistor 206. The p-channel field effect transistor 433 receives, at its gate, a control signal output by the operational amplifier 422, and in accordance with the control signal, a resistance between the drain and the source varies.

The p-channel field effect transistor 205 has a source connected to the drain of the p-channel field effect transistor 431, a gate connected to the differential input terminal Vip, and a drain connected to the differential output terminal Von. The p-channel field effect transistor 206 has a source connected to the drain of the p-channel field effect transistor 432, a gate connected to the differential input terminal Vin, and a drain connected to the differential output terminal Vop.

A series connection circuit of the inductor 207 and the resistor 209 is a load circuit, and connected between the drain of the p-channel field effect transistor 205 and a reference potential node. The reference potential node is, for example, a ground potential node, and is a node whose electric potential is lower than that of the power supply potential node. A series connection circuit of the inductor 208 and the resistor 210 is a load circuit, and connected between the drain of the p-channel field effect transistor 206 and the reference potential node.

The p-channel field effect transistors 205 and 206 receive the differential input signals at the differential input terminals Vip and Vin at their gates, and generate the differential output signals at the output terminals Vop and Von at their drains. When the operational amplifier 422 controls the control signal at the gate of the p-channel field effect transistor 433, the resistance between the drain and the source of the p-channel field effect transistor 433 is controlled, resulting in that a DC gain of the differential amplifier circuit unit 401 is controlled to be constant.

The replica amplifier circuit unit 402 is a replica of the differential amplifier circuit unit 401. The replica amplifier circuit unit 402 includes p-channel field effect transistors 411 to 417, resistors 418 to 421, and the operational amplifier 422.

The p-channel field effect transistor 412 is a replica transistor of the p-channel field effect transistor 431, and has a source connected to the power supply potential node, and a gate connected to the gates of the p-channel field effect transistors 431 and 432. The p-channel field effect transistor 413 is a replica transistor of the p-channel field effect transistor 432, and has a source connected to the power supply potential node, and a gate connected to the gates of the p-channel field effect transistors 431 and 432.

The p-channel field effect transistor 415 is a replica transistor of the p-channel field effect transistor 433, and has a source connected to a source of the p-channel field effect transistor 416, a gate connected to the output terminal of the operational amplifier 422, and a drain connected to a source of the p-channel field effect transistor 417.

The p-channel field effect transistor 416 is a replica transistor of the p-channel field effect transistor 205, and has a source connected to a drain of the p-channel field effect transistor 412. The p-channel field effect transistor 417 is a replica transistor of the p-channel field effect transistor 206, and has a source connected to a drain of the p-channel field effect transistor 413.

The resistor 419 is a load circuit, and is a replica of the resistor 209. The resistor 419 is connected between a drain of the p-channel field effect transistor 416 and the reference potential node.

The resistor 420 is a load circuit, and is a replica of the resistor 210. The resistor 420 is connected between a drain of the p-channel field effect transistor 417 and the reference potential node.

The p-channel field effect transistor 411 and the resistor 418 form a voltage generation circuit, and generate a reference voltage V1. The p-channel field effect transistor 416 receives the reference voltage V1 at its gate. The p-channel field effect transistor 411 has a source connected to the power supply potential node, a gate connected to the gates of the p-channel field effect transistors 431 and 432, and a drain connected to the gate of the p-channel field effect transistor 416. The resistor 418 is connected between the drain of the p-channel field effect transistor 411 and the reference potential node.

The p-channel field effect transistor 414 and the resistor 421 form a voltage generation circuit, and generate a reference voltage V2. The p-channel field effect transistor 417 receives the reference voltage V2 at its gate. The p-channel field effect transistor 414 has a source connected to the power supply potential node, a gate connected to the gates of the o-channel field effect transistors 431 and 432, and a drain connected to the gate of the p-channel field effect transistor 417. The resistor 421 is connected between the drain of the p-channel field effect transistor 414 and the reference potential node.

The operational amplifier 422 has a − input terminal connected to the gate of the p-channel field effect transistor 416, a + input terminal connected to the drain of the p-channel field effect transistor 417, and the output terminal connected to the gates of the p-channel field effect transistors 415 and 433.

The p-channel field effect transistor 403 has a source connected to the power supply potential node, and a gate and a drain which are connected to each other. The p-channel field effect transistor 404 has a drain connected to the drain of the p-channel field effect transistor 403, a gate connected to the BGR bias generator 405, and a source connected to the reference potential node. Further, the gate of the p-channel field effect transistor 403 is connected to the gates of the p-channel field effect transistors 431 and 432.

The BGR bias generator 405 generates a BGR (Band Gap Reference) voltage, and supplies the generated BGR voltage, as a bias voltage (second bias voltage), to the gate of the p-channel field effect transistor 404. Consequently, a bias voltage for current source circuit (first bias voltage) is generated at the gate of the p-channel field effect transistor 403, and the generated bias voltage is supplied to the respective gates of the p-channel field effect transistors 411 to 414, 431, and 432.

The p-channel field effect transistors 403, 411 to 414, 431, and 432 are current mirror circuits. A current Ib flows through the p-channel field effect transistors 412, 413, 431, and 432. Through the p-channel field effect transistor 411, a current Ib×3/2 whose amount is 3/2 times that of the current Ib flows, based on an adjustment of a transistor size, for example. Through the p-channel field effect transistor 414, a current Ib×1/2 whose amount is 1/2 times that of the current Ib flows, based on an adjustment of a transistor size, for example.

To the gate of the p-channel field effect transistor 416, the reference voltage V1 is input. To the gate of the p-channel field effect transistor 417, the reference voltage V2 is input. The reference voltages V1 and V2 are mutually different voltages. The reference voltage V1 is higher than the reference voltage V2.

The p-channel field effect transistors 416 and 417 receive the reference voltages V1 and V2 at their gates, and generate replica output signals V3 and V4 at their drains. The replica output signal V3 is a signal at the drain of the p-channel field effect transistor 417. The replica output signal V4 is a signal at the drain of the p-channel field effect transistor 416. The replica amplifier circuit unit 402 amplifies differential input signals of the reference voltages V1 and V2, and outputs differential output signals of the replica output signals V3 and V4. The replica amplifier circuit unit 402 does not include replicas of the variable capacitor 203 and the inductors 207, 208, so that a gain with respect to a frequency is substantially constant.

The operational amplifier 422 supplies the control signal to the gates of the p-channel field effect transistors 415 and 433, in accordance with a difference between the replica output signal V3 and the reference voltage V1. The operational amplifier 422 generates the control signal so as to make the gain of the replica amplifier circuit unit 402 to be constant.

Note that the operational amplifier 422 may also output the control signal in accordance with a difference between the replica output signal V4 and the reference voltage V2.

The gains of the amplifier circuit unit 401 and the replica amplifier circuit unit 402 vary according to the temperature. For example, the gains of the amplifier circuit unit 401 and the replica amplifier circuit unit 402 increase, resulting in that the signal at the differential output terminal Vop and the replica output signal V3 rise. Accordingly, the difference between the replica output signal V3 and the reference voltage V1 becomes large, and the control signal to be output by the operational amplifier 422 rises. Accordingly, the resistance between the drain and the source of the p-channel field effect transistor 415 becomes high, and the gain of the replica amplifier circuit unit 402 decreases. As a result of this, the replica output signal V3 falls. Through the above-described control, the operational amplifier 422 generates the control signal so as to make the gain of the replica amplifier circuit unit 402 to be constant.

In a similar manner, the resistance between the drain and the source of the p-channel field effect transistor 433 becomes high, and the gain of the differential amplifier circuit unit 401 decreases. As a result of this, the signal at the differential output terminal Vop falls. The DC gain of the amplifier circuit unit 401 is controlled to be constant, regardless of the temperature.

By using the replica amplifier circuit unit 402, the differential amplifier circuit 400 can make the DC gain of the differential amplifier circuit unit 401 to be constant, with the simple control. Further, since the differential amplifier circuit unit 401 controls the DC gain by using the p-channel field effect transistor 433, there is no element to be added and connected to the pair of input nodes Vip and Vin, and thus the input load is not increased, resulting in that a high-speed operation in the differential amplifier circuit 400 can be maintained.

Second Embodiment

Figure 5:
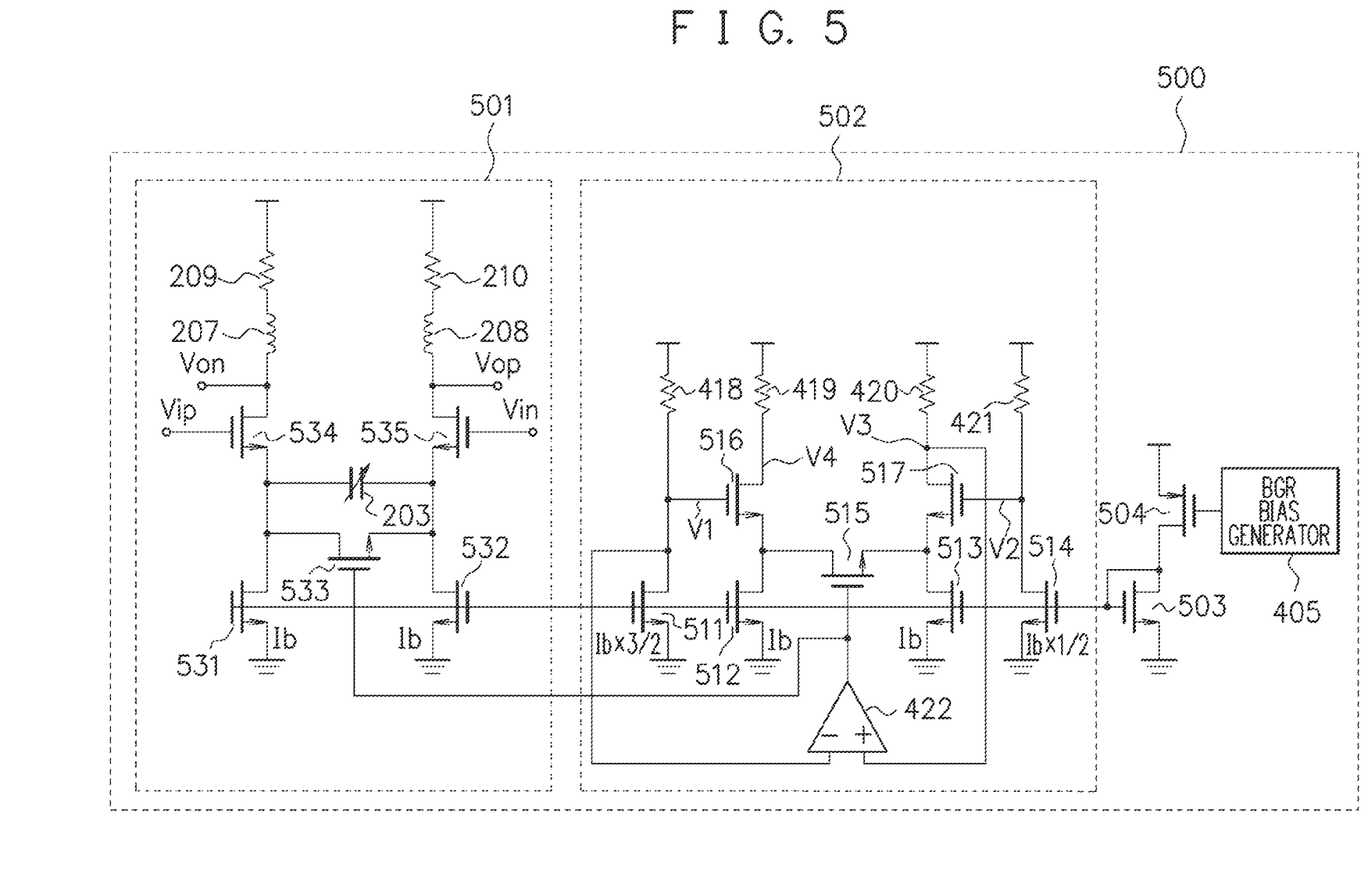
FIG. 5 is a circuit diagram illustrating a configuration example of a differential amplifier circuit according to a second embodiment.

FIG. 5 is a circuit diagram illustrating a configuration example of a differential amplifier circuit 500 according to a second embodiment. The CTLE 114 in FIG. 1 includes the differential amplifier circuit 500. The differential amplifier circuit 500 corresponds to the differential amplifier circuit 400 in FIG. 4, in which n-channel field effect transistors are provided instead of the p-channel field effect transistors, and a p-channel field effect transistor is provided instead of the n-channel field effect transistor.

The differential amplifier circuit 500 includes a differential amplifier circuit unit 501, a replica amplifier circuit unit 502, an n-channel field effect transistor 503, a p-channel field effect transistor 504, and the BGR bias generator 405.

The differential amplifier circuit unit 501 includes n-channel field effect transistors 531 to 533, the variable capacitor 203, n-channel field effect transistors 534, 535, the inductors 207, 208, and the resistors 209, 210.

The n-channel field effect transistor 531 is a current source circuit, and has a source connected to the reference potential node. The n-channel field effect transistor 532 is a current source circuit, and has a source connected to the reference potential node, and a gate connected to a gate of the n-channel field effect transistor 531.

The variable capacitor 203 is connected between a drain of the n-channel field effect transistor 531 and a drain of the n-channel field effect transistor 532. The n-channel field effect transistor 533 has a source connected to a source of the n-channel field effect transistor 535, a gate connected to the output terminal of the operational amplifier 422, and a drain connected to a source of the n-channel field effect transistor 534. The n-channel field effect transistor 533 receives, at its gate, a control signal output by the operational amplifier 422, and in accordance with the control signal, a resistance between the drain and the source varies.

The n-channel field effect transistor 534 has a source connected to the drain of the n-channel field effect transistor 531, a gate connected to the differential input terminal Vip, and a drain connected to the differential output terminal Von.

The n-channel field effect transistor 535 has a source connected to the drain of the n-channel field effect transistor 532, a gate connected to the differential input terminal Vin, and a drain connected to the differential output terminal Vop.

A series connection circuit of the inductor 207 and the resistor 209 is a load circuit, and connected between the drain of the n-channel field effect transistor 534 and the power supply potential node. A series connection circuit of the inductor 208 and the resistor 210 is a load circuit, and connected between the drain of the n-channel field effect transistor 535 and the power supply potential node.

The n-channel field effect transistors 534 and 535 receive the differential input signals at the differential input terminals Vip and Vin at their gates, and generate the differential output signals at the output terminals Vop and Von at their drains. When the operational amplifier 422 controls the control signal at the gate of the n-channel field effect transistor 533, the resistance between the drain and the source of the n-channel field effect transistor 533 is controlled, resulting in that a DC gain of the differential amplifier circuit unit 501 is controlled to be constant.

The replica amplifier circuit unit 502 is a replica of the differential amplifier circuit unit 501. The replica amplifier circuit unit 502 includes n-channel field effect transistors 511 to 517, the resistors 418 to 421, and the operational amplifier 422.

The n-channel field effect transistor 512 is a replica transistor of the n-channel field effect transistor 531, and has a source connected to the reference potential node, and a gate connected to the gates of the n-channel field effect transistors 531 and 532. The n-channel field effect transistor 513 is a replica transistor of the n-channel field effect transistor 532, and has a source connected to the reference potential node, and a gate connected to the gates of the n-channel field effect transistors 531 and 532.

The n-channel field effect transistor 515 is a replica transistor of the n-channel field effect transistor 533, and has a source connected to a source of the n-channel field effect transistor 517, a gate connected to the output terminal of the operational amplifier 422, and a drain connected to a source of the n-channel field effect transistor 516.

The n-channel field effect transistor 516 is a replica transistor of the n-channel field effect transistor 534, and has a source connected to a drain of the n-channel field effect transistor 512. The n-channel field effect transistor 517 is a replica transistor of the n-channel field effect transistor 535, and has a source connected to a drain of the n-channel field effect transistor 513.

The resistor 419 is a load circuit, and is a replica of the resistor 209. The resistor 419 is connected between a drain of the n-channel field effect transistor 516 and the power supply potential node.

The resistor 420 is a load circuit, and is a replica of the resistor 210. The resistor 420 is connected between a drain of the n-channel field effect transistor 517 and the power supply potential node.

The n-channel field effect transistor 511 and the resistor 418 form a voltage generation circuit, and generate a reference voltage V1. The n-channel field effect transistor 516 receives the reference voltage V1 at its gate. The n-channel field effect transistor 511 has a source connected to the reference potential node, a gate connected to the gates of the n-channel field effect transistors 531 and 532, and a drain connected to the gate of the n-channel field effect transistor 516. The resistor 418 is connected between the drain of the n-channel field effect transistor 511 and the power supply potential node.

The n-channel field effect transistor 514 and the resistor 421 form a voltage generation circuit, and generate a reference voltage V2. The n-channel field effect transistor 517 receives the reference voltage V2 at its gate. The n-channel field effect transistor 514 has a source connected to the reference potential node, a gate connected to the gates of the n-channel field effect transistors 531 and 532, and a drain connected to the gate of the n-channel field effect transistor 517. The resistor 421 is connected between the drain of the n-channel field effect transistor 514 and the power supply potential node.

The operational amplifier 422 has the − input terminal connected to the gate of the n-channel field effect transistor 516, the + input terminal connected to the drain of the n-channel field effect transistor 517, and the output terminal connected to the gates of the n-channel field effect transistors 515 and 533.

The n-channel field effect transistor 503 has a source connected to the reference potential node, and a gate and a drain connected to the gate of the n-channel field effect transistor 514. The p-channel field effect transistor 504 has a drain connected to the drain of the n-channel field effect transistor 503, a gate connected to the BGR bias generator 405, and a source connected to the power supply potential node.

The BGR bias generator 405 generates the BGR voltage, and supplies the generated BGR voltage, as a bias voltage (third bias voltage), to the gate of the n-channel field effect transistor 504. Consequently, a bias voltage for current source circuit (first bias voltage) is generated at the gate of the n-channel field effect transistor 503, and the generated bias voltage is supplied to the respective gates of the n-channel field effect transistors 511 to 514, 531, and 532.

The n-channel field effect transistors 503, 511 to 514, 531, and 532 are current mirror circuits. The current Ib flows through the n-channel field effect transistors 512, 513, 531, and 532. The current IbX3/2 flows through the n-channel field effect transistor 511. The current IbX1/2 flows through the n-channel field effect transistor 514.

To the gate of the n-channel field effect transistor 516, the reference voltage V1 is input. To the gate of the n-channel field effect transistor 517, the reference voltage V2 is input. The reference voltages V1 and V2 are mutually different voltages. The reference voltage V1 is lower than the reference voltage V2.

The n-channel field effect transistors 516 and 517 receive the reference voltages V1 and V2 at their gates, and generate replica output signals V3 and V4 at their drains. The replica output signal V3 is a signal at the drain of the n-channel field effect transistor 517. The replica output signal V4 is a signal at the drain of the n-channel field effect transistor 516. The replica amplifier circuit unit 502 amplifies differential input signals of the reference voltages V1 and V2, and outputs differential output signals of the replica output signals V3 and V4. The replica amplifier circuit unit 502 does not include replicas of the variable capacitor 203 and the inductors 207, 208, so that a gain with respect to a frequency is substantially constant.

The operational amplifier 422 supplies the control signal to the gates of the n-channel field effect transistors 515 and 533, in accordance with a difference between the replica output signal V3 and the reference voltage V1. The operational amplifier 422 generates the control signal so as to make the gain of the replica amplifier circuit unit 502 to be constant.

Note that the operational amplifier 422 may also output the control signal in accordance with a difference between the replica output signal V4 and the reference voltage V2.

The gains of the amplifier circuit unit 501 and the replica amplifier circuit unit 502 vary according to the temperature. For example, the gains of the amplifier circuit unit 501 and the replica amplifier circuit unit 502 decrease, resulting in that the signal at the differential output terminal Vop and the replica output signal V3 rise. Accordingly, the difference between the replica output signal V3 and the reference voltage V1 becomes large, and the control signal to be output by the operational amplifier 422 rises. Accordingly, the resistance between the drain and the source of the n-channel field effect transistor 515 is lowered, and the gain of the replica amplifier circuit unit 502 increases. As a result of this, the replica output signal V3 falls. Through the above-described control, the operational amplifier 422 generates the control signal so as to make the gain of the replica amplifier circuit unit 502 to be constant.

In a similar manner, the resistance between the drain and the source of the n-channel field effect transistor 533 is lowered, and the gain of the differential amplifier circuit unit 501 increases. As a result of this, the signal at the differential output terminal Vop falls. The DC gain of the amplifier circuit unit 501 is controlled to be constant, regardless of the temperature.

By using the replica amplifier circuit unit 502, the differential amplifier circuit 500 can make the DC gain of the differential amplifier circuit unit 501 to be constant, with the simple control. Further, since the differential amplifier circuit unit 501 controls the DC gain by using the n-channel field effect transistor 533, there is no element to be added and connected to the pair of input nodes Vip and Vin, and thus the input load is not increased, resulting in that a high-speed operation in the differential amplifier circuit 500 can be maintained.

Third Embodiment

Figure 6:
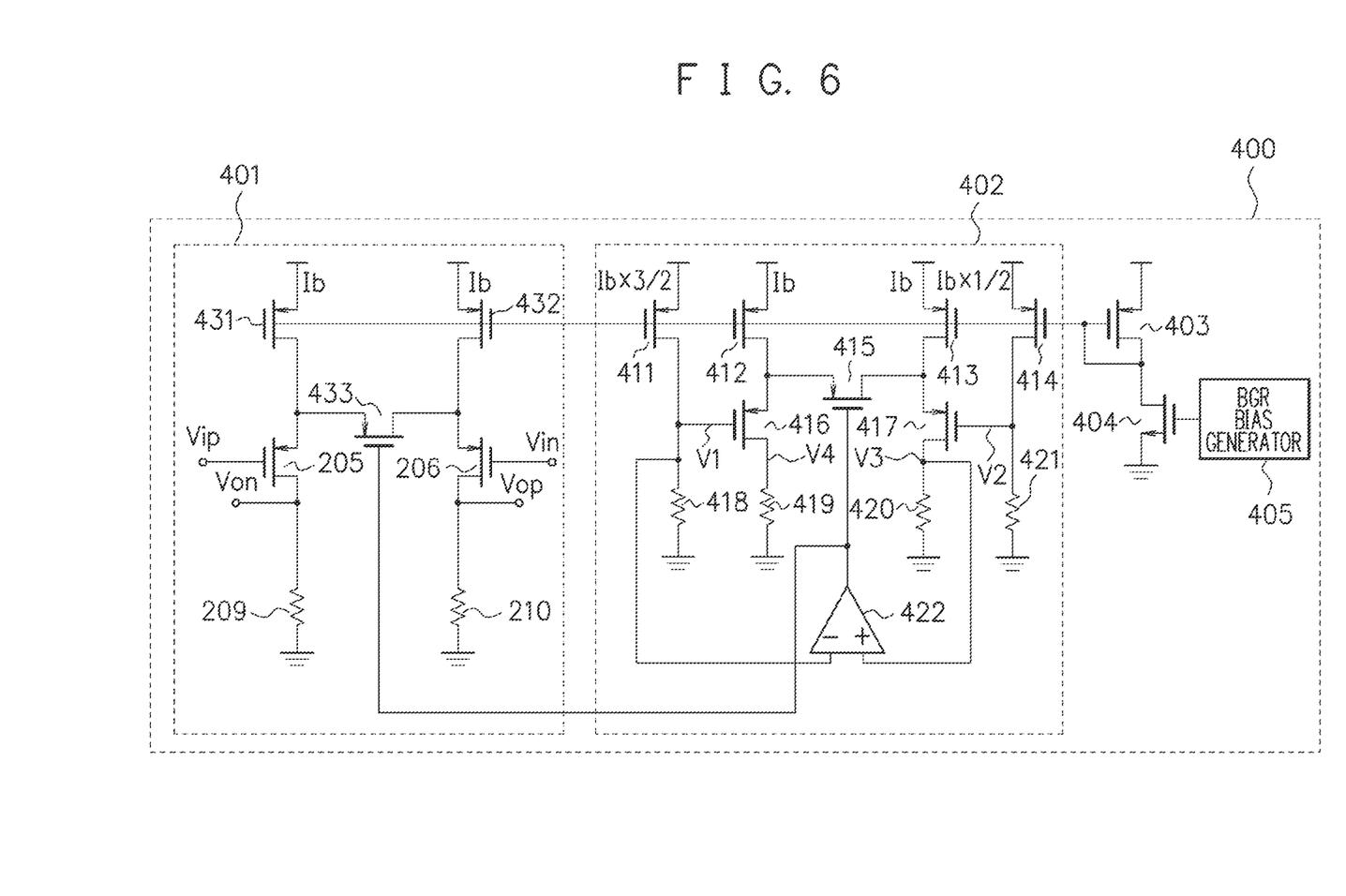
FIG. 6 is a circuit diagram illustrating a configuration example of a differential amplifier circuit according to a third embodiment.

FIG. 6 is a circuit diagram illustrating a configuration example of a differential amplifier circuit 400 according to a third embodiment. The differential amplifier circuit 400 in FIG. 6 corresponds to the differential amplifier circuit 400 in FIG. 4, from which the variable capacitor 203 and the inductors 207, 208 are deleted. The resistor 209 is a load circuit, and connected between the drain of the p-channel field effect transistor 205 and the reference potential node. The resistor 210 is a load circuit, and connected between the drain of the p-channel field effect transistor 206 and the reference potential node. In the differential amplifier circuit unit 401, the gain with respect to the frequency becomes substantially constant.

In the third embodiment, the operational amplifier 422 generates the control signal so as to make the gains of the differential amplifier circuit unit 401 and the replica amplifier circuit unit 402 to be constant, regardless of the temperature, in a similar manner to the first embodiment. By using the replica amplifier circuit unit 402, the differential amplifier circuit 400 can make the gain of the differential amplifier circuit unit 401 to be constant, with simple control. Further, since the differential amplifier circuit unit 401 controls the DC gain by using the p-channel field effect transistor 433, there is no element to be added and connected to the pair of input nodes Vip and Vin, and thus the input load is not increased, resulting in that a high-speed operation in the differential amplifier circuit 400 can be maintained.

Note that it is possible to delete the variable capacitor 203 and the inductors 207, 208 also from the differential amplifier circuit 500 in FIG. 5.

The above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

In a differential amplifier circuit, it is possible to make a gain of a differential amplifier circuit unit to be constant with simple control, while maintaining a high-speed operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A differential amplifier circuit, comprising:
a differential amplifier circuit unit; and
a replica amplifier circuit unit, wherein:
the differential amplifier circuit unit includes:
first and second transistors provided between a current source circuit and a load circuit, and configured to receive differential input signals at gates thereof to generate differential output signals at drains thereof; and
a third transistor connected between sources of the first and second transistors, and configured to receive a control signal at a gate thereof; and
the replica amplifier circuit unit includes:
a voltage generation circuit configured to generate first and second reference voltages;
first and second replica transistors being replicas of the first and second transistors, the first and second replica transistors being configured to receive the first and second reference voltages at gates thereof to generate replica output signals at drains thereof;
a third replica transistor connected between sources of the first and second replica transistors, and configured to receive the control signal, at a gate thereof; and
an operational amplifier configured to generate the control signal in accordance with a difference between at least one of the first and second reference voltages and the replica output signal, wherein
the operational amplifier is configured to generate the control signal so that a gain of the replica amplifier circuit unit is constant.

2. The differential amplifier circuit according to claim 1, wherein:
the current source circuit includes fourth and fifth transistors;
the load circuit includes first and second load circuits;
the source of the first transistor is connected to a drain of the fourth transistor;
the drain of the first transistor is connected to the first load circuit;
the source of the second transistor is connected to a drain of the fifth transistor;
the drain of the second transistor is connected to the second load circuit; and
a gate of the fourth transistor and a gate of the fifth transistor are connected to each other, and a first bias voltage is supplied to the gate of the fourth transistor and the gate of the fifth transistor.

3. The differential amplifier circuit according to claim 2, wherein
the replica amplifier circuit unit includes:
a fourth replica transistor a drain of which is connected to the source of the first replica transistor;
a fifth replica transistor a drain of which is connected to the source of the second replica transistor;
a third load circuit connected to the drain of the first replica transistor; and
a fourth load circuit connected to the drain of the second replica transistor, wherein
a gate of the fourth replica transistor and a gate of the fifth replica transistor are connected to each other, and the first bias voltage is supplied to the gate of the fourth replica transistor and the gate of the fifth replica transistor.

4. The differential amplifier circuit according to claim 3, wherein
the voltage generation circuit includes:
a sixth transistor a drain of which is connected to the gate of the first replica transistor, and a gate of which is connected to the gate of the fourth replica transistor;
a first resistor connected to the gate of the first replica transistor;
a seventh transistor a drain of which is connected to the gate of the second replica transistor, and a gate of which is connected to the gate of the fifth replica transistor; and
a second resistor connected to the gate of the second replica transistor.

5. The differential amplifier circuit according to claim 4, wherein
the first bias voltage is supplied to the gate of the sixth transistor and the gate of the seventh transistor.

6. The differential amplifier circuit according to claim 4, wherein:
the first to seventh transistors and the first to fifth replica transistors are p-channel field effect transistors;
sources of the fourth to seventh transistors and sources of the fourth and fifth replica transistors are connected to a power supply potential node;
the first load circuit is connected between the drain of the first transistor and a reference potential node an electric potential of which is lower than that of the power supply potential node;
the second load circuit is connected between the drain of the second transistor and the reference potential node;
the third load circuit is connected between the drain of the first replica transistor and the reference potential node; and
the fourth load circuit is connected between the drain of the second replica transistor and the reference potential node.

7. The differential amplifier circuit according to claim 6, further comprising:
an eighth transistor a source of which is connected to the power supply potential node, and a gate and a drain of which are connected to each other;
a ninth transistor a drain of which is connected to the drain of the eighth transistor, and a source of which is connected to the reference potential node; and a bias generator configured to supply a second bias voltage to a gate of the ninth transistor, wherein the first bias voltage is configured to be generated at the gate of the eighth transistor.

8. The differential amplifier circuit according to claim 4, wherein:

the first to seventh transistors and the first to fifth replica transistors are n-channel field effect transistors;

sources of the fourth to seventh transistors and sources of the fourth and fifth replica transistors are connected to a reference potential node;

the first load circuit is connected between the drain of the first transistor and a power supply potential node an electric potential of which is higher than that of the reference potential node;

the second load circuit is connected between the drain of the second transistor and the power supply potential node;

the third load circuit is connected between the drain of the first replica transistor and the power supply potential node; and the fourth load circuit is connected between the drain of the second replica transistor and the power supply potential node.

9. The differential amplifier circuit according to claim 8, further comprising:

an eighth transistor a source of which is connected to the reference potential node, and a gate and a drain of which are connected to each other;

a ninth transistor a drain of which is connected to the drain of the eighth transistor, and a source of which is connected to the power supply potential node; and a bias generator configured to supply a third bias voltage to a gate of the ninth transistor, wherein the first bias voltage is configured to be generated at the gate of the eighth transistor.

10. The differential amplifier circuit according to claim 1, wherein the differential amplifier circuit unit includes a capacitor connected between the drain of the first transistor and the drain of the second transistor.

11. The differential amplifier circuit according to claim 3, wherein:

the first load circuit is a series connection circuit of a third resistor and a first inductor;

the second load circuit is a series connection circuit of a fourth resistor and a second inductor;

the third load circuit is a fifth resistor; and the fourth load circuit is a sixth resistor.

12. The differential amplifier circuit according to claim 3, wherein:

the first load circuit is a third resistor;

the second load circuit is a fourth resistor;

the third load circuit is a fifth resistor; and the fourth load circuit is a sixth resistor.

13. The differential amplifier circuit according to claim 1, wherein the first and second reference voltages are voltages which are different from each other.

14. A reception circuit, comprising:

a continuous time linear equalizer;

a decision feedback equalizer configured to receive an output signal of the continuous time linear equalizer;

a clock generator configured to output a clock signal to the decision feedback equalizer; and a demultiplexer configured to receive an output signal of the decision feedback equalizer, wherein the continuous time linear equalizer includes a differential amplifier circuit, wherein the differential amplifier circuit includes:

a differential amplifier circuit unit; and a replica amplifier circuit unit, wherein:

the differential amplifier circuit unit includes:

first and second transistors provided between a current source circuit and a load circuit, and configured to receive differential input signals at gates thereof to generate differential output signals at drains thereof; and a third transistor connected between sources of the first and second transistors, and configured to receive a control signal at a gate thereof; and the replica amplifier circuit unit includes:

a voltage generation circuit configured to generate first and second reference voltages;

first and second replica transistors being replicas of the first and second transistors, the first and second replica transistors being configured to receive the first and second reference voltages at gates thereof to generate replica output signals at drains thereof;

a third replica transistor connected between sources of the first and second replica transistors, and configured to receive the control signal at a gate thereof; and an operational amplifier configured to generate the control signal in accordance with a difference between at least one of the first and second reference voltages and the replica output signal, wherein the operational amplifier is configured to generate the control signal so that a gain of the replica amplifier circuit unit is constant.

15. The reception circuit according to claim 14, wherein:

the current source circuit includes fourth and fifth transistors;

the load circuit includes first and second load circuits;

the source of the first transistor is connected to a drain of the fourth transistor;

the drain of the first transistor is connected to the first load circuit;

the source of the second transistor is connected to a drain of the fifth transistor;

the drain of the second transistor is connected to the second load circuit; and a gate of the fourth transistor and a gate of the fifth transistor are connected to each other, and a first bias voltage is supplied to the gate of the fourth transistor and the gate of the fifth transistor.

16. The reception circuit according to claim 15, wherein the replica amplifier circuit unit includes:

a fourth replica transistor a drain of which is connected to the source of the first replica transistor;

a fifth replica transistor a drain of which is connected to the source of the second replica transistor;

a third load circuit connected to the drain of the first replica transistor; and a fourth load circuit connected to the drain of the second replica transistor, wherein a gate of the fourth replica transistor and a gate of the fifth replica transistor are connected to each other, and the first bias voltage is supplied to the gate of the fourth replica transistor and the gate of the fifth replica transistor.

17. The reception circuit according to claim 16, wherein the voltage generation circuit includes:
a sixth transistor a drain of which is connected to the gate of the first replica transistor, and a gate of which is connected to the gate of the fourth replica transistor;
a first resistor connected to the gate of the first replica transistor;
a seventh transistor a drain of which is connected to the gate of the second replica transistor, and a gate of which is connected to the gate of the fifth replica transistor; and
a second resistor connected to the gate of the second replica transistor.

18. The reception circuit according to claim 17, wherein the first bias voltage is supplied to the gate of the sixth transistor and the gate of the seventh transistor.

19. The reception circuit according to claim 14, wherein the differential amplifier circuit unit includes a capacitor connected between the drain of the first transistor and the drain of the second transistor.

20. A semiconductor integrated circuit, comprising:
a reception circuit; and
an internal circuit configured to process an output signal of the reception circuit, wherein
the reception circuit includes:
a continuous time linear equalizer;
a decision feedback equalizer configured to receive an output signal of the continuous time linear equalizer;
a clock generator configured to output a clock signal to the decision feedback equalizer; and
a demultiplexer configured to receive an output signal of the decision feedback equalizer, wherein
the continuous time linear equalizer includes a differential amplifier circuit, wherein
the differential amplifier circuit includes:
a differential amplifier circuit unit; and
a replica amplifier circuit unit, wherein:
the differential amplifier circuit unit includes:
first and second transistors provided between a current source circuit and a load circuit, and configured to receive differential input signals at gates thereof to generate differential output signals at drains thereof; and
a third transistor connected between sources of the first and second transistors, and configured to receive a control signal at a gate thereof; and
the replica amplifier circuit unit includes:
a voltage generation circuit configured to generate first and second reference voltages;
first and second replica transistors being replicas of the first and second transistors, and the first and second replica transistors being configured to receive the first and second reference voltages at gates thereof to generate replica output signals at drains thereof;
a third replica transistor connected between sources of the first and second replica transistors, and configured to receive the control signal at a gate; and
an operational amplifier configured to generate the control signal in accordance with a difference between at least one of the first and second reference voltages and the replica output signal, wherein
the operational amplifier is configured to generate the control signal so that a gain of the replica amplifier circuit unit is constant.

* * * * *